United States Patent
Lee et al.

(10) Patent No.: US 9,455,018 B2
(45) Date of Patent: Sep. 27, 2016

(54) MEMORY DEVICE INCLUDING POWER-UP CONTROL CIRCUIT, AND MEMORY SYSTEM HAVING THE SAME

(71) Applicant: Samsung Electronics Co., Ltd., Suwon-si (KR)

(72) Inventors: Seung-Hun Lee, Hwaseong-si (KR); Hyung-Chan Choi, Seoul (KR); Won-Jae Shin, Seoul (KR)

(73) Assignee: SAMSUNG ELECTRONICS CO., LTD., Samsung-ro, Yeongtong-gu, Suwon-si, Gyeonggi-do ( * ) Notice: Subject to any disclaimer, the term of this patent is extended or adjusted under 35 U.S.C. 154(b) by 0 days.

(21) Appl. No.: 14/837,294

(22) Filed: Aug. 27, 2015

(65) Prior Publication Data

US 2016/0141015 A1   May 19, 2016

(30) Foreign Application Priority Data

Nov. 14, 2014  (KR) .................. 10-2014-0158449

(51) Int. Cl.
*G11C 11/4074* (2006.01)
*G11C 11/408* (2006.01)

(52) U.S. Cl.
CPC ........ *G11C 11/4074* (2013.01); *G11C 11/4087* (2013.01)

(58) Field of Classification Search
USPC ......................................... 365/229
See application file for complete search history.

(56) References Cited

U.S. PATENT DOCUMENTS

| 5,652,730 A | 7/1997 | Kono et al. |
| 6,417,704 B1 | 7/2002 | Nakajima et al. |
| 6,697,289 B1 | 2/2004 | Yamamoto |
| 7,831,845 B2 | 11/2010 | Lee |
| 2005/0184770 A1 | 8/2005 | Sohn et al. |
| 2006/0192607 A1* | 8/2006 | Chun ............ G11C 5/145 327/536 |
| 2007/0024351 A1 | 2/2007 | Kang |

FOREIGN PATENT DOCUMENTS

| JP | 2000-181581 A | 6/2000 |
| JP | 2003-168296 A | 6/2003 |
| JP | 2012-018711 A | 1/2012 |
| KR | 10-2006-0012788 A | 2/2006 |
| KR | 10-2007-0076081 A | 7/2007 |

* cited by examiner

*Primary Examiner* — Hoai V Ho
(74) *Attorney, Agent, or Firm* — Muir Patent Law, PLLC

(57) ABSTRACT

A memory device may include a power-up control circuit and a first set of boost voltage generators. The power-up control circuit may be configured to consecutively activate a first set of power-up signals with a first delay time between each power-up signal of the first set of power-up signals in response to a rise of a power supply voltage and a reset signal having a first logic level at an initial stage of power-up. The first set of boost voltage generators may be configured to generate an internal boost voltage based on an external boost voltage and the first set of power-up signals. The first set of boost voltage generators may be configured to activate before the reset signal transitions from the first logic level to a second logic level opposite to the first logic level.

20 Claims, 11 Drawing Sheets

MEMORY DEVICE INCLUDING POWER-UP CONTROL CIRCUIT, AND MEMORY SYSTEM HAVING THE SAME

CROSS-REFERENCE TO RELATED APPLICATION(S)

This application claims priority under 35 USC §119 to Korean Patent Application No. 10-2014-0158449, filed on Nov. 14, 2014 in the Korean Intellectual Property Office (KIPO), the contents of which are herein incorporated by reference in their entirety.

BACKGROUND

1. Technical Field

Example embodiments relate to a semiconductor device, and more particularly to a memory device and a memory system having the memory device.

2. Description of the Related Art

When power is on in an electronic system, the power is also provided to a memory device included in the electronic system. The memory device drives internal circuits using a provided voltage such that the memory device consumes a current.

Since the memory device is typically used to charge loads of the internal circuits during a power-up stage, the memory device may consume a lot of current at that time.

If the current consumption of the memory device during power-up exceeds the maximum current consumption allowed for the electronic system, the electronic system may be shut down.

SUMMARY

Some example embodiments are directed to provide a memory device that disperses a current consumption over time during power-up.

Some example embodiments are directed to provide a memory system including the memory device.

According to example embodiments, a memory device includes a power-up control circuit and a first set of boost voltage generators. The power-up control circuit is configured to consecutively activate a first set of power-up signals with a first delay time between each power-up signal of the first set of power-up signals in response to a rise of a power supply voltage and a reset signal having a first logic level at an initial stage of power-up. The first set of boost voltage generators are configured to generate an internal boost voltage based on an external boost voltage and the first set of power-up signals. The first set of boost voltage generators are configured to activate before the reset signal transitions from the first logic level to a second logic level opposite to the first logic level.

In example embodiments, the power-up control circuit may include a pulse generation circuit configured to generate a first pulse signal having a first period when the supply voltage is at a first level and the reset signal is at the logic level, and to generate a second pulse signal having a second period shorter than the first period when the reset signal is at the second logic level, and a pulse control circuit configured to consecutively activate the first set of power-up signals in response to the first pulse signal, and to consecutively activate the second set of power-up signals in response to the second pulse signal.

The pulse generation circuit may include an inverter configured to invert the reset signal to generate an inverted reset signal, a first AND gate configured to perform an AND operation on the power supply voltage and the inverted reset signal to generate a first enable signal, a second AND gate configured to perform an AND operation on the power supply voltage and the reset signal to generate a second enable signal, a first pulse generator configured to generate the first pulse signal in response to the first enable signal being activated, and a second pulse generator configured to generate the second pulse signal in response to the second enable signal being activated.

In example embodiments, the memory device includes a memory cell array including a plurality of memory cells connected to a plurality of word lines. The internal boost voltage may be provided to a word line of the plurality of word lines coupled to a memory cell included in the memory cell array.

In example embodiments, the memory cell array may include a plurality of memory banks each of which includes a plurality of memory cells, and a plurality of bank row decoders coupled to the plurality of memory banks through a plurality of word lines. The plurality of bank row decoders may provide the internal boost voltage to at least one of the plurality of word lines based on a row address.

According to example embodiments, a memory system includes a voltage regulator, a memory controller, and a memory device. The voltage regulator is configured to output a first boost voltage and a power supply voltage at an initial stage of power-up of the memory system. The memory controller is configured to transition a reset signal from a first logic level to a second logic level opposite to the first logic level after a first time period from a time at which the voltage regulator outputs the power supply voltage. The memory device including a plurality of internal circuits is configured to activate a first set of internal circuits of the plurality of internal circuits consecutively with a first delay time between the activation of each internal circuit of the first set of internal circuits in response to the power supply voltage, and to activate a second set of internal circuits of the plurality of internal circuits consecutively with a second delay time between the activation of each internal circuit of the second set of internal circuits, which is shorter than the first delay time, in response to the reset signal transitioning from the first logic level to the second logic level.

In example embodiments, the plurality of internal circuits may include at least one boost voltage generator configured to generate a second boost voltage based on the first boost voltage.

In example embodiments, the memory device may include a power-up control circuit configured to consecutively activate a first set of power-up signals with the first delay time between activations in response to the power supply voltage and the reset signal having the first logic level, and to activate a second set of power-up signals consecutively with the second delay time between activations in response to the power supply voltage and the reset signal having the second logic level. The first and second sets of internal circuits include boost voltage generators may generate a second boost voltage based on the first boost voltage, and include a plurality of switches each connected to a corresponding boost voltage generator, the switches may consecutively activate in response to the first and second sets of power-up signals, respectively.

The power-up control circuit may include a pulse generation circuit configured to generate a first pulse signal having a first period when the power supply voltage is at a first level and the reset signal is at the first logic level, and to generate a second pulse signal having a second period shorter than the first period when the reset signal is at the second logic level, and a pulse control circuit configured to consecutively activate the first set of power-up signals in response to the first pulse signal, and to consecutively activate the second set of power-up signals in response to the second pulse signal.

The pulse generation circuit may include an inverter configured to invert the reset signal to generate an inverted reset signal, a first AND gate configured to perform an AND operation on the power supply voltage and the inverted reset signal to generate a first enable signal, a second AND gate configured to perform an AND operation on the power supply voltage and the reset signal to generate a second enable signal, a first pulse generator configured to generate the first pulse signal in response to the first enable signal being activated, and a second pulse generator configured to generate the second pulse signal in response to the second enable signal being activated.

The memory device may include a memory cell array including a plurality of memory cells connected to a plurality of word lines. The second boost voltage may be provided to a word line of the plurality of word lines.

In example embodiments, the memory device may include a plurality of semiconductor layers, which are stacked on each other and communicate signals with each other through through-substrate vias (e.g., through-silicon vias TSV), and each of the plurality of semiconductor layers may include a power-up control circuit. The power-up control circuit is configured to consecutively activate a first set of power-up signals with the first delay time between activations in response to the power supply voltage and the reset signal having the first logic level, and to activate a second set of power-up signals consecutively with the second delay time between activations in response to the power supply voltage and the reset signal having the second logic level. The first and second sets of internal circuits may include boost voltage generators configured to generate a second boost voltage based on the first boost voltage, and include a plurality of switches each connected to a corresponding boost voltage generator, the switches being configured to consecutively activate in response to the first and second sets of power-up signals.

In example embodiments, the memory device may include a master semiconductor layer and first through m-th slave semiconductor layers, which are stacked on each other and communicate signals with each other through through-substrate vias (TSVs). Here, m represents a positive integer. The master semiconductor layers may include a power-up control circuit configured to consecutively activate a first set of power-up signals with the first delay time between activations in response to the power supply voltage and the reset signal having the first logic level, and to activate a second set of power-up signals consecutively with the second delay time between activations in response to the power supply voltage and the reset signal having the second logic level. The k-th slave semiconductor layer may include the first and second sets of internal circuits including boost voltage generators configured to generate a second boost voltage based on the first boost voltage, and a plurality of switches each connected to a corresponding boost voltage generator, the switches being configured to turn on consecutively in response to the first and second sets of power-up signals, respectively. Here, k represents a positive integer equal to or smaller than m.

According to example embodiments, an electronic device includes a power-up control circuit and a first set of internal circuits. The power-up control circuit is configured to, during a power-up of the semiconductor device, consecutively generate a first set of activation signals with a first delay time between each activation signal of the first set of activation signals in response to a power supply voltage and a reset signal having a first logic level. The first set of internal circuits are configured to activate in response to the first set of activation signals, respectively.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Figure 1:
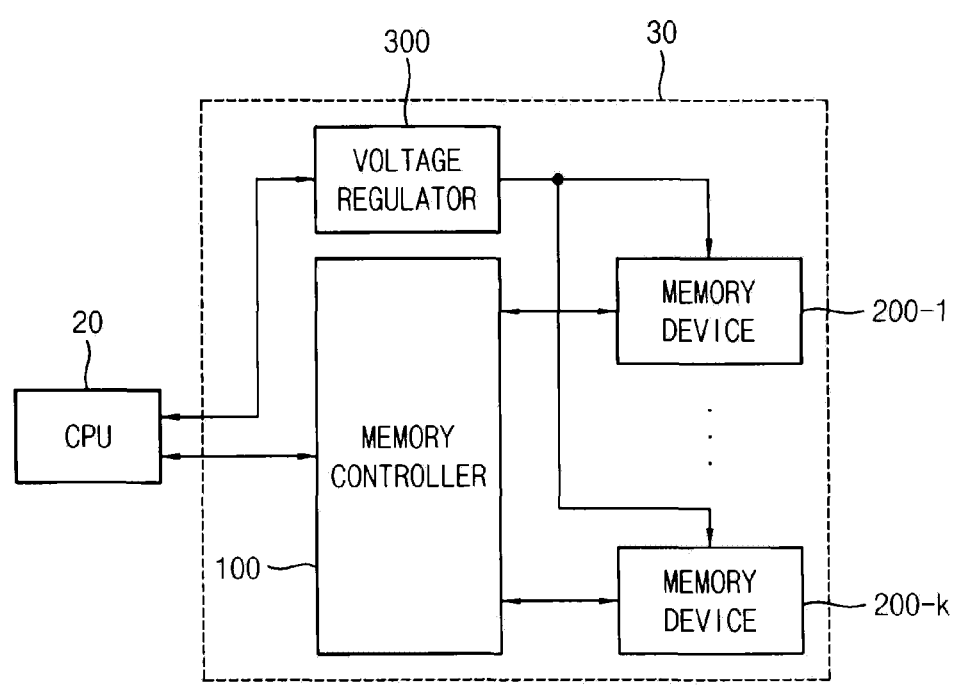
FIG. 1 is a block diagram illustrating an electronic system according to example embodiments.

Various example embodiments will be described more fully with reference to the accompanying drawings, in which some example embodiments are shown. The present inventive concept may, however, be embodied in many different forms and should not be construed as limited to the embodiments set forth herein. Like reference numerals refer to like elements throughout this application.

It will be understood that, although the terms first, second, etc. may be used herein to describe various elements, these elements should not be limited by these terms. Unless indicated otherwise, these terms are only used to distinguish one element from another. For example, a first element could be termed a second element, and, similarly, a second element could be termed a first element, without departing from the scope of the present inventive concept. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as contacting another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to example embodiments.

Referring to FIG. 1, an electronic system 10 includes a central processing unit (CPU) 20 and a memory system 30. The memory system 30 may include a memory controller 100, a plurality of memory devices 200-1~200-$k$, and a voltage regulator 300. Here, k represents a positive integer.

Although the voltage regulator 300 is included in the memory system 30 in FIG. 1, the voltage regulator 300 may be outside of the memory system 30 or inside of each of the memory devices 200-1~200-$k$ according to example embodiments.

The CPU 20 may communicate with the memory system 30 through interface protocol such as Peripheral Component Interconnect-Express (PCI-E), Advanced Technology Attachment (ATA), Serial ATA (SATA), Parallel ATA (PATA), or serial attached SCSI (SAS). In addition, the CPU 20 may communicate with the memory system 30 through interface protocol such as Universal Serial Bus (USB), Multi-Media Card (MMC), Enhanced Small Disk Interface (ESDI), or Integrated Drive Electronics (IDE).

The memory controller 100 may control overall operation of the memory system 30. The memory controller 100 may control overall data exchange between the CPU 20 and the plurality of memory devices 200-1~200-$k$. For example, the memory controller 100 may write data in the plurality of memory devices 200-1~200-$k$ or read data from the plurality of memory devices 200-1~200-$k$ in response to request from the CPU 20.

In addition, the memory controller 100 may apply operation commands to the plurality of memory devices 200-1~200-$k$ for controlling the plurality of memory devices 200-1~200-$k$.

In some embodiments, each of the plurality of memory devices 200-1~200-$k$ may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc., or may be other volatile memory devices.

The voltage regulator 300 may provide various voltages to the plurality of memory devices 200-1~200-$k$ required for an operation of the plurality of memory devices 200-1~200-$k$. For example, the voltage regulator 300 may provide a power supply voltage, which is used for overall operation of the plurality of memory devices 200-1~200-$k$, and a boost voltage, which is higher than the power supply voltage, to each of the plurality of memory devices 200-1~200-$k$.

As used herein, a semiconductor device may refer to various items such as a memory device, one or more logic devices or memory cells formed in or on a semiconductor substrate, a semiconductor chip, a memory chip, a memory die, a logic chip, a package, or combinations thereof. A semiconductor device such as a semiconductor chip, a memory chip, or a logic chip may be formed from a wafer. A semiconductor device may comprise a package which may include one or more chips stacked on a package substrate, or a package-on-package device including a plurality of packages. A semiconductor device may include an array of memory cells.

An electronic device, as used herein, may refer to one of these devices and may also include products that include these devices, such as a memory card, a memory module, a hard drive including additional components, a mobile phone, laptop, tablet, desktop, camera, server, computing system, or other consumer electronic device, etc.

Figure 2:
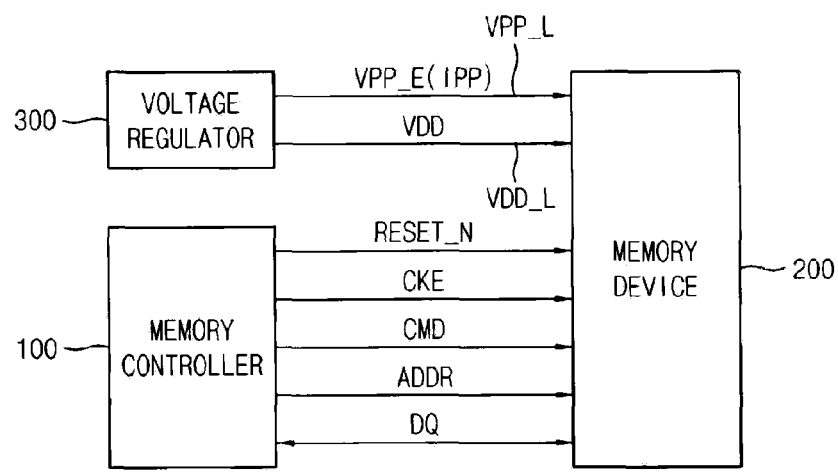
FIG. 2 is a block diagram illustrating an example of a memory system included in an electronic system of FIG. 1 according to example embodiments.

FIG. 2 is a block diagram illustrating an example of a memory system included in an electronic system of FIG. 1 according to example embodiments.

In FIG. 2, one memory device 200 included in the memory system 30 is illustrated for convenience. Each of the plurality of memory devices 200-1~200-$k$ included in the memory system 30 of FIG. 1 may be implemented with the memory device 200 of FIG. 2.

Referring to FIG. 2, the memory system 30 may include a memory controller 100, a memory device 200 and a voltage regulator 300.

Figure 3:
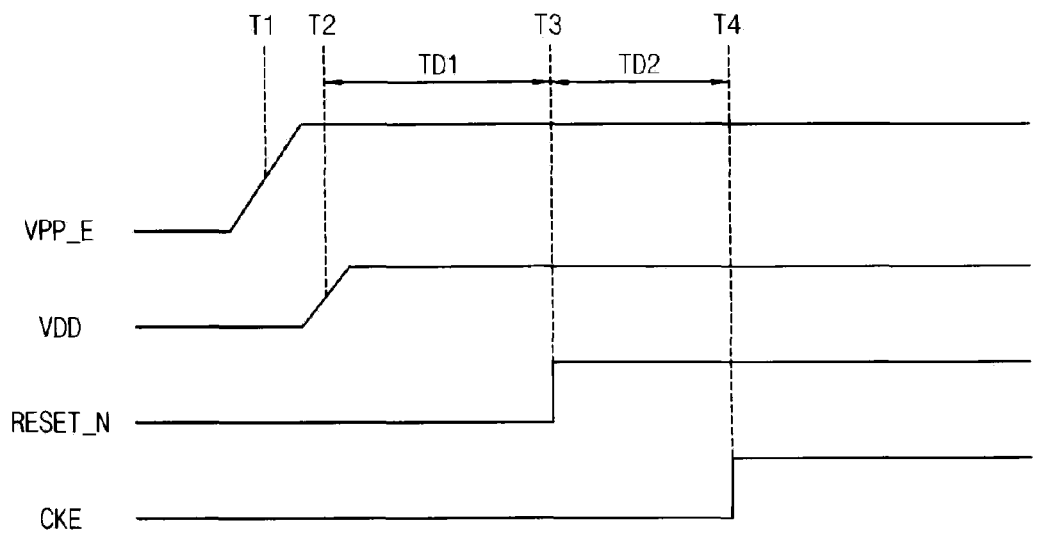
FIG. 3 is a timing diagram for describing an exemplary operation of a memory system of FIG. 2 during power-up of the memory system.

FIG. 3 is a timing diagram for describing an exemplary operation of a memory system of FIG. 2 during power-up of the memory system.

Referring to FIGS. 2 and 3, when the electronic system 10 is powered up, the voltage regulator 300 may output an external boost voltage VPP_E through a boost voltage line VPP_L and output a power supply voltage VDD through a power supply voltage line VDD_L. In some example embodiments, when the electronic system 10 is powered up, the voltage regulator 300 may output the external boost voltage VPP_E through the boost voltage line VPP_L at a first time T1 (e.g., the external boost voltage VPP_E may be stable or reached at a first threshold voltage level at the first time T1), and then output the power supply voltage VDD through the power supply voltage line VDD_L at a second time T2, which is later than the first time T1. The power supply voltage VDD may be stable or reached at a second threshold voltage level at the second time T2. For example, the second threshold voltage level may be greater than a ground voltage and less than a full level of the power supply voltage VDD. The external boost voltage VPP_E may be higher than the power supply voltage VDD.

The memory controller 100 may maintain a reset signal RESET_N at a first logic level (e.g., a logic low level) at an initial stage of power-up of the electronic system 10, and transition the reset signal RESET_N from the first logic level to a second logic level (e.g., a logic high level) at a third time T3, which is after a first time duration TD1 from the second time T2. For example, a plurality of internal circuits of the memory device 200 may be initialized after transitioning the reset signal RESET_N from the first logic level to the second logic level. For example, the first time duration TD1 may be about 200 us (micro seconds) to 2 s (second). It is assumed that the initial stage of power-up may indicate a state prior to a stable fully powered up state. For example, a time duration prior to the second time T2 may indicate the initial stage of power-up.

The memory controller 100 may transition a clock enable signal CKE from the logic low level to the logic high level at a fourth time T4, which is after a second time duration TD2 from the third time T3. For example, the second time duration TD2 may be 500 us. A time duration prior to the fourth time T4 may indicate a period of time for a power-up.

When the electronic system 10 is powered up, the memory device 200 may turn on a plurality of internal circuits, which are included in the memory device 200, using the external boost voltage VPP_E for initialization by the fourth time T4, at which the clock enable signal CKE transitions from the logic low level to the logic high level.

In some example embodiments, when the memory device 200 receives the power supply voltage VDD from the voltage regulator 300 through the power supply voltage line VDD_L at the second time T2, the memory device 200 may turn on the plurality of internal circuits consecutively by providing the external boost voltage VPP_E to the plurality of internal circuits consecutively with a first delay time between the activation of each internal circuit.

If the reset signal RESET_N transitions from the logic low level to a logic high level at the third time T3 before all of the plurality of internal circuits are turned on, the memory device 200 may turn on internal circuits in a turned off state among the plurality of internal circuits consecutively with a second delay time between an activation of each internal circuit, which is shorter than the first delay time.

At least one of the plurality of internal circuits may correspond to a boost voltage generator that generates an internal boost voltage based on the external boost voltage VPP_E.

When each of the plurality of internal circuits is turned on, loads, such as capacitors, included in each of the plurality of internal circuits may be charged by a boost current IPP provided from the voltage regulator 300 through the boost voltage line VPP_L.

For example, if the memory device 200 turns on the plurality of internal circuits during a power-up state of the electronic system 10, a magnitude of the boost current IPP provided from the voltage regulator 300 to the memory device 200 may be large at a short time.

However, as described above, the memory device 200 may turn on the plurality of internal circuits consecutively.

For example, a current consumption of the memory device 200 during a power-up state of the electronic system 10 may be dispersed over time.

After the fourth time T4, the memory device 200 may perform a normal operation. For example, after the fourth time T4, the memory controller 100 may provide a command signal CMD and an address signal ADDR to the memory device 200 to perform a write operation and a read operation on the memory device 200 such that the memory controller 100 and the memory device 200 may communicate data DQ.

The boost current IPP may flow from the voltage regulator 300 to the memory device 200 through the boost voltage line VPP_L while the memory device 200 performs the initialization operation and the normal operation. If the magnitude of the boost current IPP is excessively great, elements included in the electronic system 10 may be damaged. For example, the voltage regulator 300 may monitor the magnitude of the boost current IPP flowing to the memory device 200. The voltage regulator 300 may shut down and stop generating the external boost voltage VPP_E and the power supply voltage VDD if the magnitude of the boost current IPP exceeds a magnitude of a predetermined threshold current.

As described above, the memory device 200 according to example embodiments is not turned on the plurality of internal circuits at the same time but turned on the plurality of internal circuits consecutively. For example, a current consumption of the memory device 200 during a power-up state of the electronic system 10 may be dispersed over time. As such, the voltage regulator 300 may be effectively prevented from shutting down during a power-up state of the electronic system 10.

Figure 4:
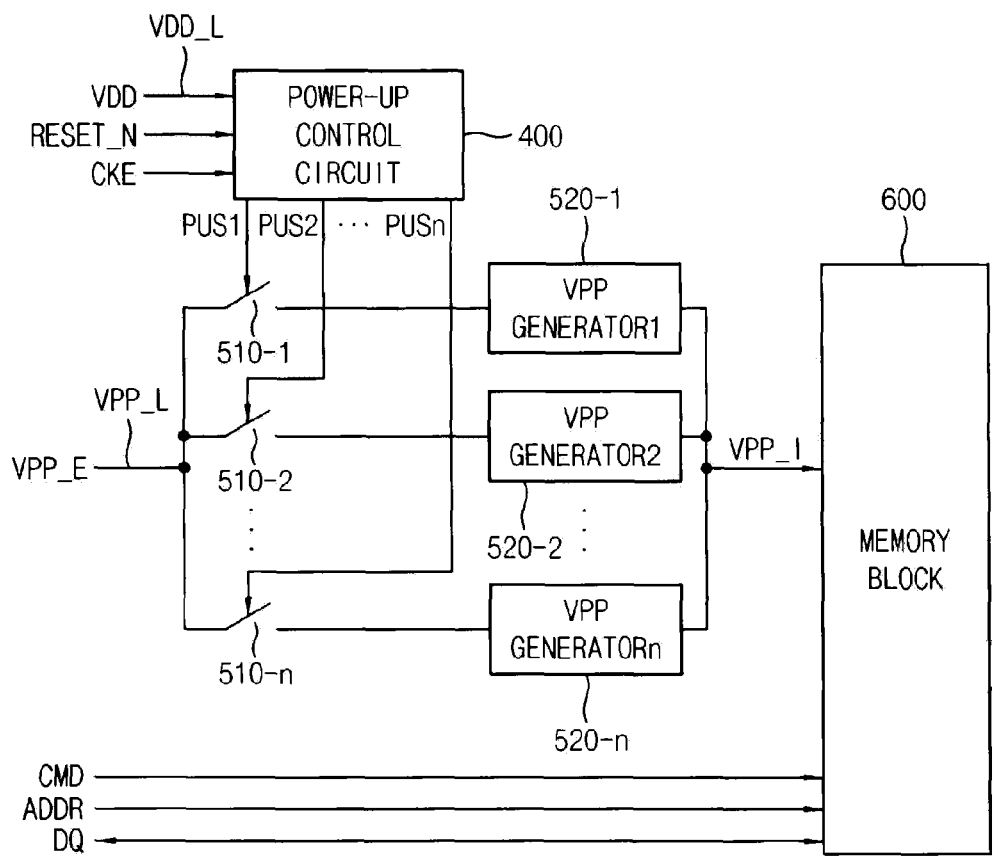
FIG. 4 is a block diagram illustrating an example of a memory device included in a memory system of FIG. 2 according to one embodiment.

FIG. 4 is a block diagram illustrating an example of a memory device included in a memory system of FIG. 2 according to one embodiment.

Referring to FIG. 4, a memory device 200a may include a power-up control circuit 400, first through n-th switches 510-1, 510-2, ..., 510-n, first through n-th boost voltage generators 520-1, 520-2, ..., 520-n, and a memory block 600. Here, n represents a positive integer.

When the power-up control circuit 400 receives the power supply voltage VDD from the voltage regulator 300 through the power supply voltage line VDD_L during a power-up state of the electronic system 10, the power-up control circuit 400 may activate first through n-th power-up signals PUS1, PUS2, ..., PUSn consecutively.

In some example embodiments, the power-up control circuit 400 may activate the first through n-th power-up signals PUS1, PUS2, ..., PUSn consecutively with the first delay time between activations in response to a rise of the power supply voltage VDD, and change the first delay time between activations of some of the first through n-th power-up signals PUS1, PUS2, ..., PUSn to the second delay time between activations, which is shorter than the first delay time, in response to the reset signal RESET_N transitioning from the logic low level to the logic high level before all of the first through n-th power-up signals PUS1, PUS2, ..., PUSn are activated. In one embodiment, the first through n-th power-up signals PUS1, PUS2, ..., PUSn may be generated after the power supply voltage VDD is reached at the second voltage level.

In one embodiment, first through n-th boost voltage generators 520-1, 520-2, ..., 520-n may be other internal circuits such as a negative voltage generators used to generate a negative voltage lower than a ground voltage.

Figure 5:
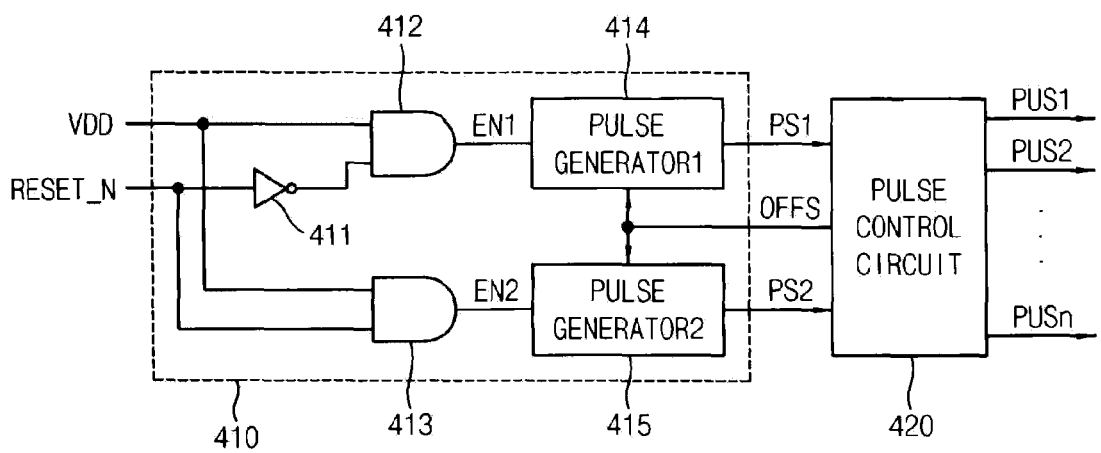
FIG. 5 is a block diagram illustrating an example of a power-up control circuit included in a memory device of FIG. 4 according to one embodiment.

FIG. 5 is a block diagram illustrating an example of a power-up control circuit included in a memory device of FIG. 4 according to one embodiment.

Referring to FIG. 5, the power-up control circuit 400 may include a pulse generation circuit 410 and a pulse control circuit 420.

The pulse generation circuit 410 may generate a first pulse signal PS1 having a first period after the power supply voltage VDD is reached at the second threshold voltage level and the reset signal RESET_N is at the logic low level, and generate a second pulse signal PS2 having the second period after the power supply voltage VDD is reached at the second threshold voltage level and the reset signal RESET_N is at the logic high level.

As illustrated in FIG. 5, the pulse generation circuit 410 may include an inverter 411, a first AND gate 412, a second AND gate 413, a first pulse generator 414, and a second pulse generator 415.

The inverter 411 may invert the reset signal RESET_N to generate an inverted reset signal.

The first AND gate 412 may perform an AND operation on the power supply voltage VDD and the inverted reset signal to generate a first enable signal EN1.

The second AND gate 413 may perform an AND operation on the power supply voltage VDD and the reset signal RESET_N to generate a second enable signal EN2.

The first pulse generator 414 may generate the first pulse signal PS1 having the first period when the first enable signal EN1 is activated.

The second pulse generator 415 may generate the second pulse signal PS2 having the second period when the second enable signal EN2 is activated.

The pulse control circuit 420 may receive the first pulse signal PS1 and the second pulse signal PS2. The pulse control circuit 420 may consecutively activate the first through n-th power-up signals PUS1, PUS2, ..., PUSn in response to the first pulse signal PS1 and the second pulse signal PS2. After the pulse control circuit 420 is activated all of the first through n-th power-up signals PUS1, PUS2, ..., PUSn, the pulse control circuit 420 may provide a turn-off signal OFFS to the first pulse generator 414 and the second pulse generator 415, and the first pulse generator 414 and the second pulse generator 415 may be turned off in response to the turn-off signal OFFS.

Figure 6:
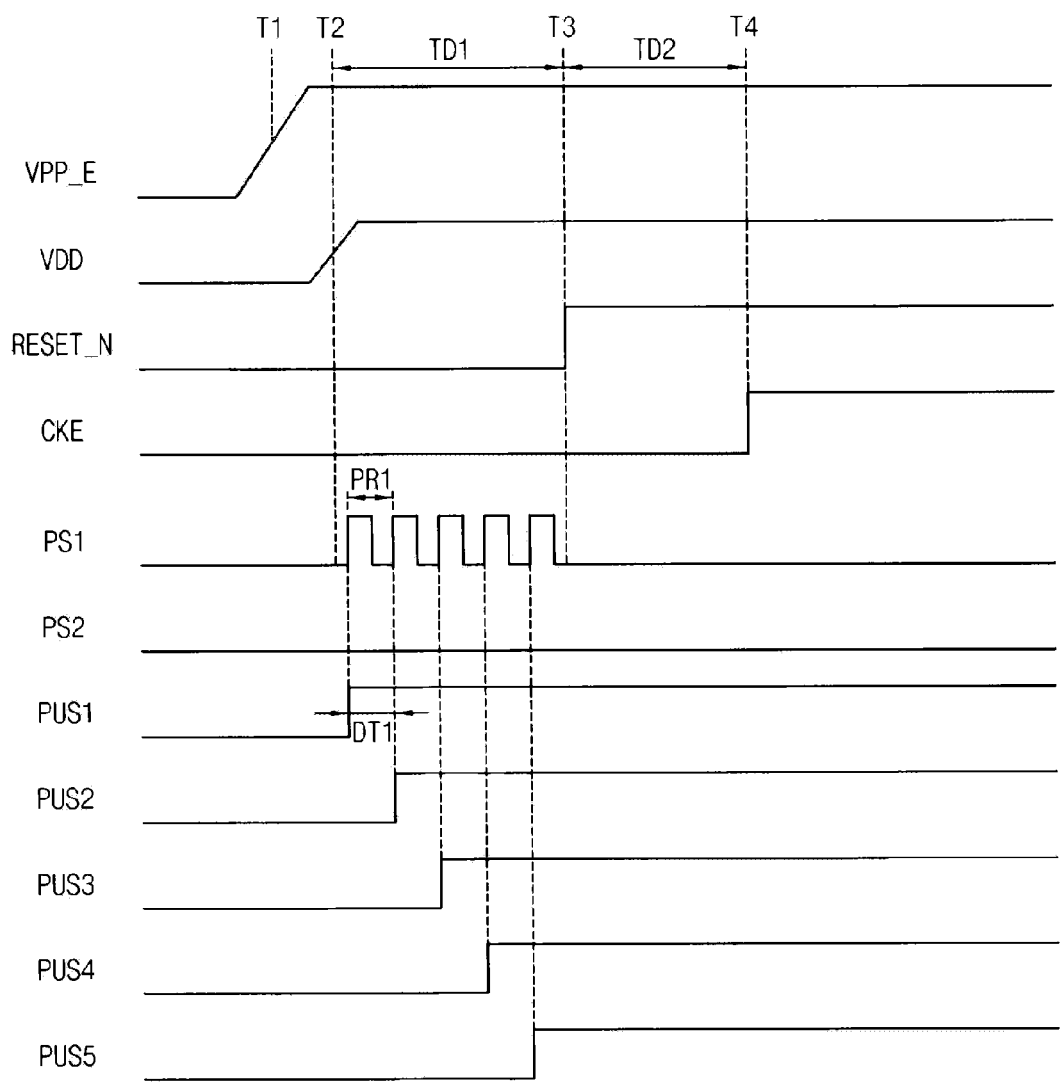
FIGS. 6 and 7 are timing diagrams for describing an operation of a pulse generation circuit of FIG. 5 according to example embodiments.
Figure 7:
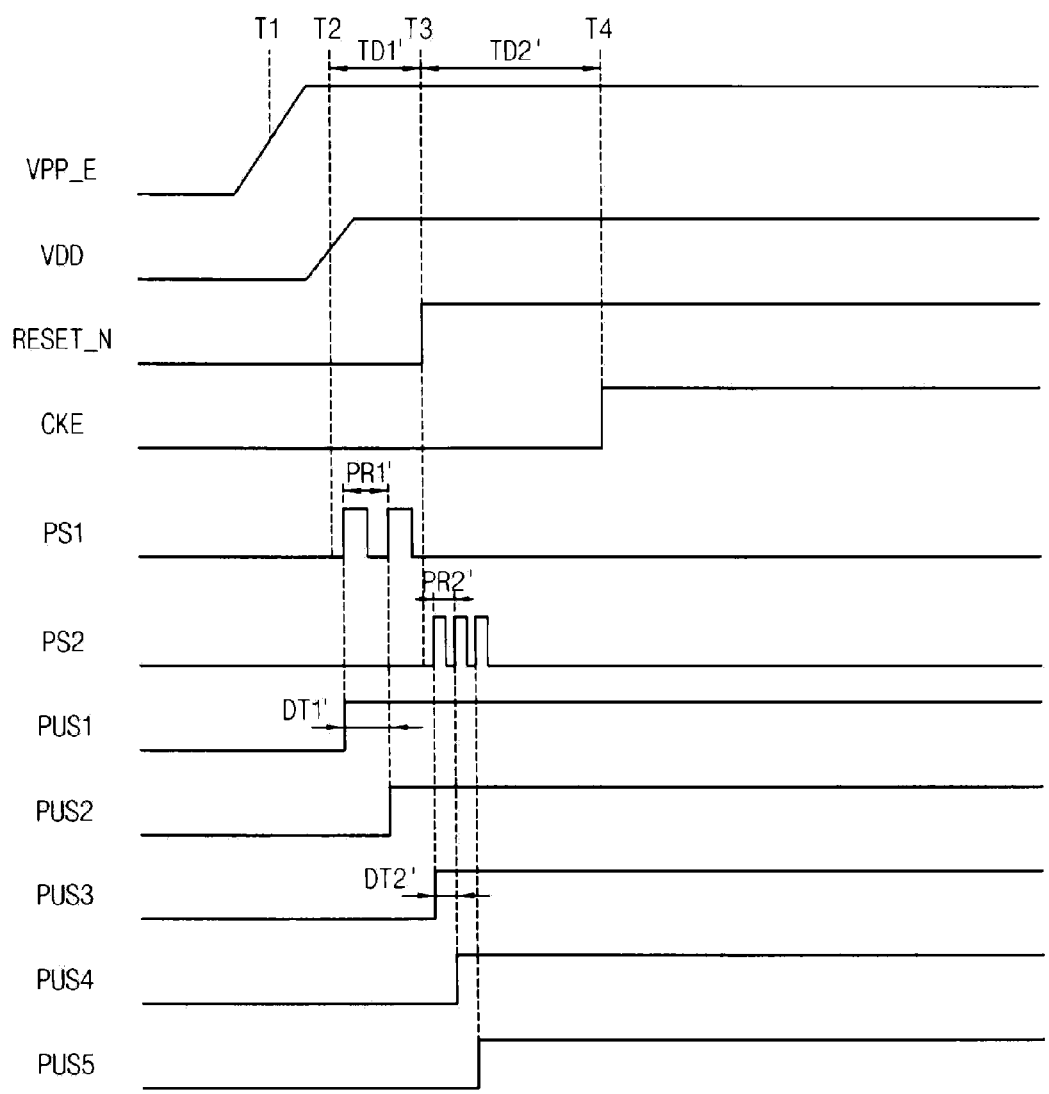

FIGS. 6 and 7 are timing diagrams for describing an operation of a pulse generation circuit of FIG. 5 according to example embodiments.

In FIGS. 6 and 7, an operation of the pulse generation circuit 410 in a case that the memory device 200a includes first through fifth switches 510-1, 510-2, ..., 510-5, and first through fifth boost voltage generators 520-1, 520-2, ..., 520-5 is illustrated as an example. However, example embodiments are not limited thereto.

FIG. 6 represents an operation of the pulse generation circuit 410 when the first time duration TD1 is relatively long such that all of the first through fifth power-up signals PUS1, PUS2, ..., PUS5 are activated before the reset signal RESET_N transitions from the logic low level to the logic high level at the third time T3.

Referring to FIGS. 5 and 6, since the reset signal RESET_N is maintained at the logic low level when the voltage regulator 300 outputs the power supply voltage VDD having the second threshold voltage level at the second time T2, the first AND gate 412 may activate the first enable signal EN1 after the second time T2. For example, the first pulse generator 414 may generate the first pulse signal PS1 having the first period PR1 after the second time T2.

The pulse control circuit 420 may consecutively activate the first through fifth power-up signals PUS1, PUS2, ..., PUS5 with a first delay time DT1 between each power-up signal in response to five pulses included in the first pulse signal PS1 with the first period PR1. For example, a first pulse of the first pulse signal PS1 may be generated in response to the power supply voltage VDD having the second threshold voltage level at the second time T2. A time value of the first delay time DT1 between each power-up signal may be the same as a time value of the first period PR1.

After the pulse control circuit 420 is activated all of the first through fifth power-up signals PUS1, PUS2, ..., PUS5, the pulse control circuit 420 may provide the turn-off signal OFFS to the first pulse generator 414 and the second pulse generator 415 to turn off the first pulse generator 414 and the second pulse generator 415.

As described above with reference to FIG. 6, when the first time duration TD1 is relatively long, the first through n-th power-up signals PUS1, PUS2, ..., PUSn may be activated consecutively with the first delay time DT1 between activations.

FIG. 7 represents an operation of the pulse generation circuit 410 when a first time duration TD1' is relatively short such that all of the first through fifth power-up signals PUS1, PUS2, ..., PUS5 are not activated before the reset signal RESET_N transitions from the logic low level to the logic high level at the third time T3.

Referring to FIGS. 5 and 7, since the reset signal RESET_N is maintained at the logic low level when the voltage regulator 300 outputs the power supply voltage VDD having the second threshold voltage level at the second time T2, the first AND gate 412 may activate the first enable signal EN1 after the second time T2. For example, the first pulse generator 414 may generate the first pulse signal PS1 having a first period PR1' after the second time T2.

The pulse control circuit 420 may consecutively activate the first and second power-up signals PUS1 and PUS2 with a first delay time DT1' between the first and second power-up signals PUS1 and PUS2 in response to two pulses included in the first pulse signal PS1 with the first period PR1'. For example, a first pulse of the first pulse signal PS1 may be generated in response to the power supply voltage VDD having the second threshold voltage level at the second time T2. A time value of the first delay time DT1' may be the same as a time value of the first period PR1'.

Since the reset signal RESET_N transitions from the logic low level to the logic high level at the third time T3, the first AND gate 412 may deactivate the first enable signal EN1 and the second AND gate 413 may activate the second enable signal EN2 after the third time T3. For example, the second pulse generator 415 may generate the second pulse signal PS2 having a second period PR2' after the third time T3. For example, the second period PR2' may be shorter than the first period PR1'.

The pulse control circuit 420 may consecutively activate the third through fifth power-up signals PUS3, PUS4, and PUS5 with a second delay time DT2' between each power-up signal in response to three pulses included in the second pulse signal PS2' with the second period PR2'. For example, a time value of the second delay time DT2' may be the same as a time value of the second period PR2'.

In one embodiment, the time value of the second delay time DT2' is less than the time value of the first delay time DT1'.

After the pulse control circuit 420 is activated all of the first through fifth power-up signals PUS1, PUS2, ..., PUS5, the pulse control circuit 420 may provide the turn-off signal OFFS to the first pulse generator 414 and the second pulse generator 415 to turn off the first pulse generator 414 and the second pulse generator 415.

As described above with reference to FIG. 7, when the first time duration TD1' is relatively short, the first through n-th power-up signals PUS1, PUS2, ..., PUSn may be activated consecutively with the first delay time DT1' between each power-up signal before the third time T3, and be activated consecutively with the second delay time DT2' between each power-up signal, which is shorter than the first delay time DT1', after the third time T3.

Referring again to FIG. 4, the first through n-th switches 510-1, 510-2, ..., 510-n may be turned on consecutively in response to the first through n-th power-up signals PUS1, PUS2, ..., PUSn provided by the power-up control circuit 400. For example, the first through n-th switches 510-1, 510-2, ..., 510-n may turn on the first through n-th boost voltage generators 520-1, 520-2, ..., 520-n consecutively by providing the external boost voltage VPP_E, which is received through the boost voltage line VPP_L, to the first through n-th boost voltage generators 520-1, 520-2, ..., 520-n in response to the first through n-th power-up signals PUS1, PUS2, ..., PUSn, respectively.

Each of the first through n-th boost voltage generators 520-1, 520-2, ..., 520-n may generate an internal boost voltage VPP_I based on the external boost voltage VPP_E. The internal boost voltage VPP_I may be higher than the power supply voltage VDD. For example, a voltage level of the internal boost voltage VPP_I may be substantially the same as a voltage level of the external boost voltage VPP_E.

Figure 8:
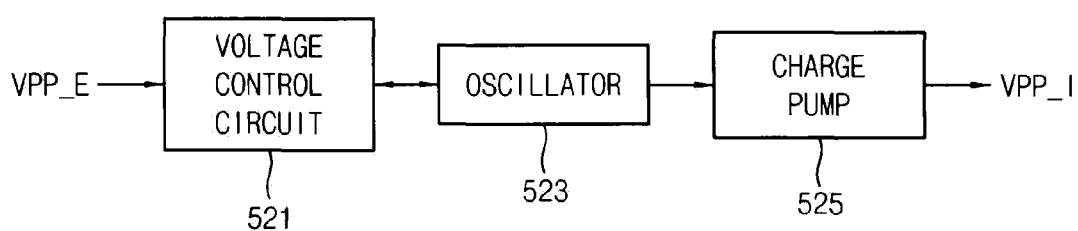
FIG. 8 is a block diagram illustrating an example of a boost voltage generator included in a memory device of FIG. 4 according to one embodiment.

FIG. 8 is a block diagram illustrating an example of a boost voltage generator included in a memory device of FIG. 4 according to one embodiment.

Each of the first through n-th boost voltage generators 520-1, 520-2, ..., 520-n may be implemented with a boost voltage generator 520 of FIG. 8.

Referring to FIG. 8, the boost voltage generator 520 may include a voltage control circuit 521, an oscillator 523, and a charge pump 525.

The voltage control circuit 521 may be turned on in response to receiving the external boost voltage VPP_E to operate the oscillator 523. The voltage control circuit 521 may detect a voltage level of the external boost voltage VPP_E for generating the internal boost voltage VPP_I.

The oscillator 523 may operate in response to the detected voltage level by the voltage control circuit 521, and generate pulse signals in complementary relationship with the detected voltage level.

The charge pump 525 may perform a pumping operation in response to the pulse signals provided by the oscillator 523 to generate the internal boost voltage VPP_I.

The structure of each of the first through n-th boost voltage generators 520-1, 520-2, ..., 520-n illustrated in FIG. 8 is an example only and the structure of each of the first through n-th boost voltage generators 520-1, 520-2, ..., 520-n according to example embodiments may not be limited thereto, but may be variously modified.

Figure 9:
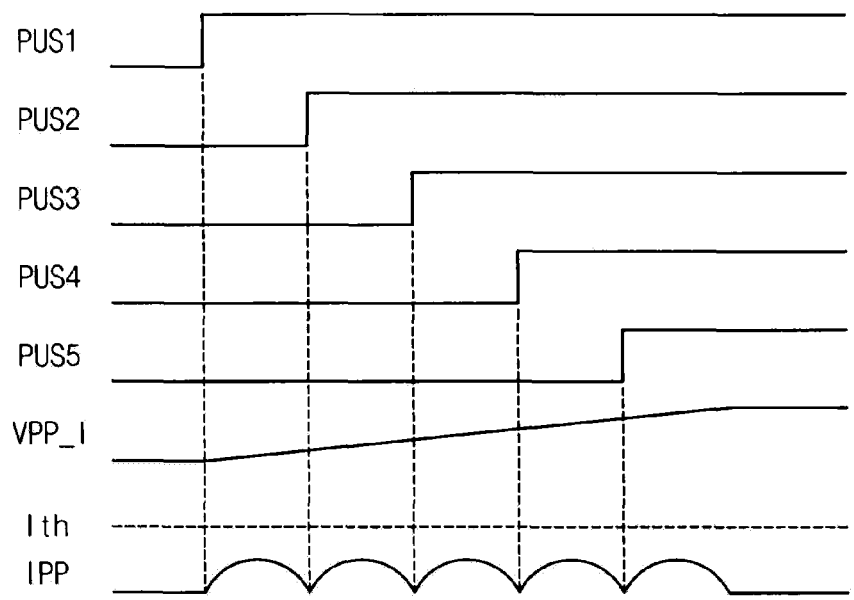
FIG. 9 is a timing diagram illustrating an internal boost voltage and a boost current generated during a power-up stage of a memory system of FIG. 2 according to example embodiments.

FIG. 9 is a timing diagram illustrating an internal boost voltage and a boost current generated during a power-up state of a memory system of FIG. 2 according to example embodiments.

When each of the first through n-th boost voltage generators 520-1, 520-2, ..., 520-n is turned on in response to the external boost voltage VPP_E, loads, such as capacitors, included in each of the first through n-th boost voltage generators 520-1, 520-2, ..., 520-n may be charged by the boost current IPP provided from the voltage regulator 300 through the boost voltage line VPP_L. For example, each of the first through n-th boost voltage generators 520-1, 520-2, ..., 520-n may consume a lot of charges during a power-up state. As such, a magnitude of the boost current IPP provided from the voltage regulator 300 to the memory device 200a through the boost voltage line VPP_L may increase during a power-up stage of turning on of each of the first through n-th boost voltage generators 520-1, 520-2, ..., 520-n.

For example, if the memory device 200 turns on the first through n-th boost voltage generators 520-1, 520-2, ..., 520-n at the same time by providing the external boost voltage VPP_E to the first through n-th boost voltage generators 520-1, 520-2, ..., 520-n at the same time during a power-up state of the electronic system 10, the magnitude of the boost current IPP provided from the voltage regulator 300 to the memory device 200a may exceed a threshold current Ith, such that the voltage regulator 300 may shut down and stop generating the external boost voltage VPP_E and the power supply voltage VDD. As a result, the electronic system 10 may also shut down.

In one embodiment, the first through n-th switches 510-1, 510-2, ..., 510-n may turn on the first through n-th boost voltage generators 520-1, 520-2, ..., 520-n consecutively by providing the external boost voltage VPP_E, which is received through the boost voltage line VPP_L, to the first through n-th boost voltage generators 520-1, 520-2, ..., 520-n in response to the first through n-th power-up signals PUS1, PUS2, ..., PUSn, respectively.

For example, as illustrated in FIG. 9, the internal boost voltage VPP_I may increase slowly as the first through n-th switches 510-1, 510-2, ..., 510-n are turned on consecutively.

In addition, although the memory device 200a consumes relatively great amount of charges at the initial stage of power-up of the electronic system 10, as illustrated in FIG. 9, a current consumption of the memory device 200a during a power-up of the electronic system 10 may be dispersed over time. For example, the magnitude of the boost current IPP provided from the voltage regulator 300 to the memory device 200a during the power-up may be maintained smaller than the threshold current Ith. As such, the memory device 200a may effectively prevent the electronic system 10 from shutting down during the power-up of the electronic system 10.

Referring again to FIG. 4, the memory block 600 may include a plurality of memory cells connected to a plurality of word lines. The internal boost voltage VPP_I may be provided to at least one of the plurality of word lines. The memory block 600 may perform a write operation and a read operation after the internal boost voltage VPP_I is applied.

Figure 10:
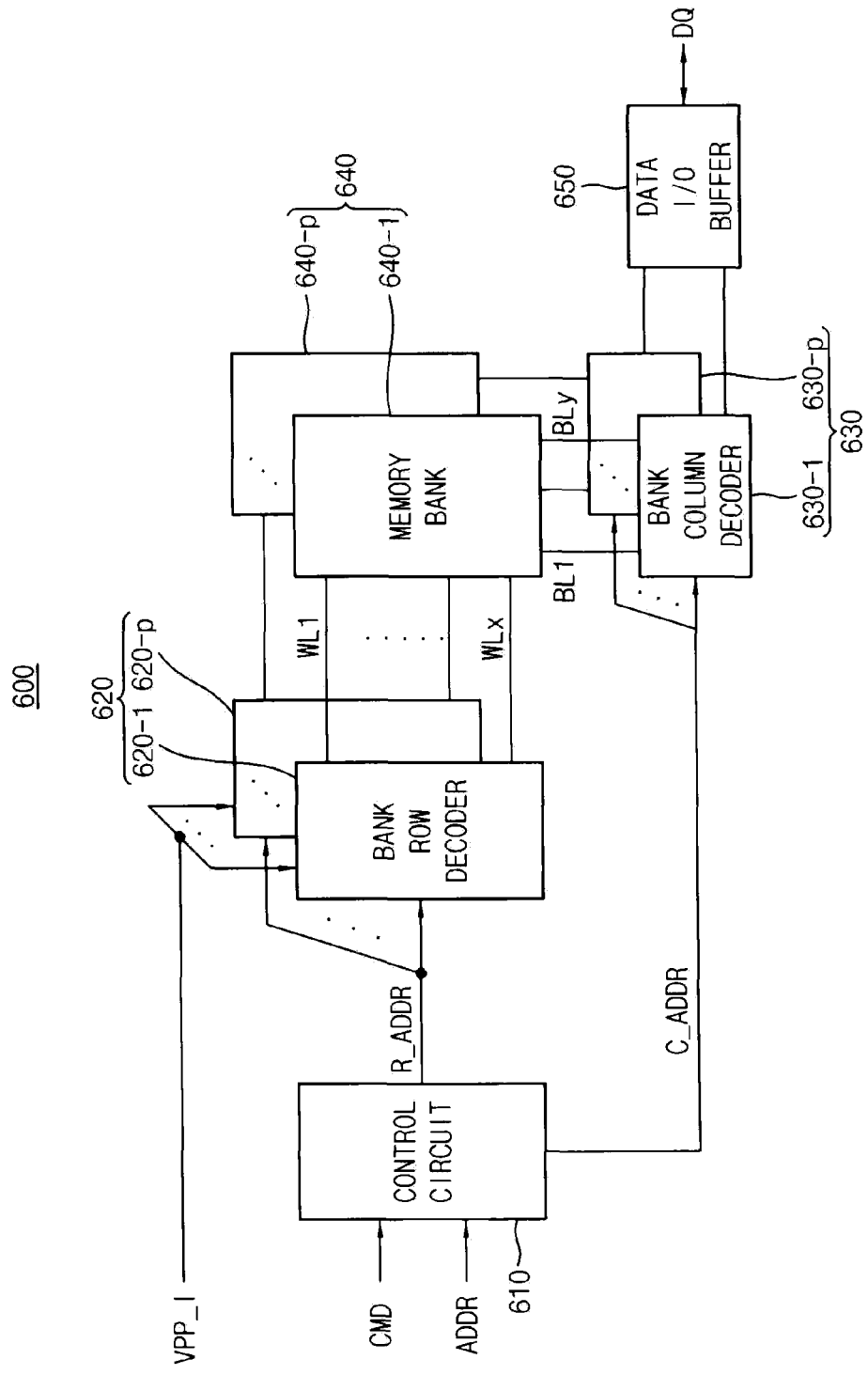
FIG. 10 is a block diagram illustrating an example of a memory block included in a memory device of FIG. 4 according to certain embodiments.

FIG. 10 is a block diagram illustrating an example of a memory block included in a memory device of FIG. 4 according to certain embodiments.

Referring to FIG. 10, the memory block 600 may include a control circuit 610, a row decoder 620, a column decoder 630, a memory cell array 640, and a data input/output buffer 650.

The memory cell array 640 may include a plurality of memory banks 640-1~640-p. Each of the plurality of memory banks 640-1~640-p may include a plurality of memory cells. Here, p represents a positive integer.

The row decoder 620 may include a plurality of bank row decoders 620-1~620-p.

Each of the plurality of bank row decoders 620-1~620-p may be coupled to the plurality of memory cells included in each of the plurality of memory banks 640-1~640-p through a plurality of word lines WL1~WLx. For example, the first bank row decoder 620-1 may be coupled to a plurality of memory cells included in the first memory bank 640-1 through a plurality of word lines WL1~WLx, and the p-th bank row decoder 620-p may be coupled to a plurality of memory cells included in the p-th memory bank 640-p through a plurality of word lines WL1~WLx. Here, x represents a positive integer.

The column decoder 630 may include a plurality of bank column decoders 630-1~630-p. Each of the plurality of bank column decoders 630-1~630-p may be coupled to the plurality of memory cells included in each of the plurality of memory banks 640-1~640-p through a plurality of bit lines BL1~BLy. For example, the first bank column decoder 630-1 may be coupled to the plurality of memory cells included in the first memory bank 630-1 through a plurality of bit lines BL1~BLy, and the p-th bank column decoder 630-p may be coupled to a plurality of memory cells included in the p-th memory bank 640-p through a plurality of bit lines BL1~BLy. Here, y represents a positive integer.

The control circuit 610 may control overall operations of the memory block 600. For example, the control circuit 610 may decode a command signal CMD received from the memory controller 100 to generate control signals for the memory block 600 to perform a write operation or a read operation. In addition, the control circuit 610 may decode an address signal ADDR received from the memory controller 100 to generate a row address R_ADDR and a column address C_ADDR. The control circuit 610 may provide the row address R_ADDR to the plurality of bank row decoders 620-1~620-p, and provide the column address C_ADDR to the plurality of bank column decoders 630-1~630-p.

Each of the plurality of bank row decoders 620-1~620-p may receive the internal boost voltage VPP_I. One of the plurality of bank row decoders 620-1~620-p that corresponds to the row address R_ADDR may provide the internal boost voltage VPP_I to one of the plurality of word lines WL1~WLx that corresponds to the row address R_ADDR to activate the word line corresponding to the row address R_ADDR.

In a write mode, one of the plurality of bank column decoders 630-1~630-p that corresponds to the column address C_ADDR may write data DQ, which is received from the data input/output buffer 650, in a memory cell coupled to one of the plurality of bit lines BL1~Bly that corresponds to the column address C_ADDR.

In a read mode, one of the plurality of bank column decoders 630-1~630-p that corresponds to the row address R_ADDR may provide data DQ, which is received by one of the plurality of bit lines BL1~Bly that corresponds to the column address C_ADDR, to the data input/output buffer 650.

The data input/output buffer 650 may provide the data DQ received from the memory controller 100 to the plurality of bank column decoders 630-1~630-p in the write mode, and provide the data DQ received from the plurality of bank column decoders 630-1~630-p to the memory controller 100 in the read mode.

As described above with reference to FIG. 3, after the fourth time T4 at which the clock enable signal CKE transitions from the logic low level to the logic high level, the memory device 200a may perform the normal operation such as a read or a write operation. For example, when the electronic system 10 is being powered up, the first through n-th boost voltage generators 520-1, 520-2, . . . , 520-n may be needed to be turned on before the fourth time T4.

In a general DRAM memory system, the first time duration TD1 or TD1', which corresponds to a time duration between a time at which the voltage regulator 300 outputs the power supply voltage VDD having the second threshold voltage level during a power-up state to a time at which the reset signal RESET_N transitions from the logic low level to the logic high level, may be about 200 us to 2 seconds.

For example, the first period PR1, which corresponds to a period with which the first through n-th power-up signals PUS1, PUS2, . . . , PUSn are activated by the power-up control circuit 400 in response to a rise of the power supply voltage VDD, may correspond to 200/n us or 2/n seconds.

If a time duration between the second time T2 and the third time T3 is relatively short, all of the first through n-th power-up signals PUS1, PUS2, . . . , PUSn may be not activated within the time duration between the second time T2 and the third time T3. It is assumed that k-th through n-th power-up signals are not activated within the time duration between the second time T2 and the third time T3.

To guarantee that all of the first through n-th boost voltage generators 520-1, 520-2, . . . , 520-n are turned on consecutively before the fourth time T4 at which the clock enable signal CKE transitions from the logic low level to the logic high level, the second delay time DT2', which corresponds to the second period PR2' with which the k-th through n-th power-up signals PUSk, PUSk+1, . . . , PUSn are activated by the power-up control circuit 400 after the third time T3, may correspond to a 1/(n−k) fraction of a time duration between a time at which the reset signal RESET_N transitions from the logic low level to the logic high level to a time at which the clock enable signal CKE transitions from the logic low level to the logic high level.

In some example embodiments, the second period PR2' may correspond to 500/(n−k) us. According to a JEDEC (Joint Electron Device Engineering Council) standard, the clock enable signal CKE transitions from the logic low level to the logic high level after at least 500 us from a time at which the reset signal RESET_N transitions from the logic low level to the logic high level. For example, when the second period PR2' is set to 500/(n-k) us, all of the first through n-th boost voltage generators 520-1, 520-2, . . . , 520-n included in the memory device 200a may be turned on before the fourth time T4.

If a signal transmission delay occurs such that the clock enable signal CKE transitions from the logic low level to the logic high level before all of the first through n-th boost voltage generators 520-1, 520-2, . . . , 520-n are turned on, the power-up control circuit 400 may activate some of the first through n-th power-up signals PUS1, PUS2, . . . , PUSn that are in a deactivated state at the same time.

As described above with reference to FIGS. 1 to 10, when the electronic system 10 is being powered up, the memory device 200a may turn on all or some of the first through n-th boost voltage generators 520-1, 520-2, . . . , 520-n consecutively with the first delay time DT1 or DT1' between the activation of each boost voltage generator while the reset signal RESET_N is maintained at the logic low level. If the reset signal RESET_N transitions from the logic low level to the logic high level before all of the first through n-th boost voltage generators 520-1, 520-2, . . . , 520-n are turned on, the memory device 200a may change a turning on time of some of the boost voltage generators 520-1, 520-2, . . . , 520-n to the second delay time DT2' between activations, which is shorter than the first delay time DT1'. For example, the memory device 200a may disperse a current consumption of the a plurality of internal circuits, for example, a boost voltage generator, a fuse circuit, or a negative voltage generator etc. included in the memory device 200a over time during a power-up of the electronic system 10. As a result, the magnitude of the boost current IPP provided from the voltage regulator 300 to the memory device 200a may be maintained smaller than the threshold current Ith. As such, the memory device 200a may effectively prevent the electronic system 10 from shutting down at the initial stage of power-up of the electronic system 10.

Figure 11:
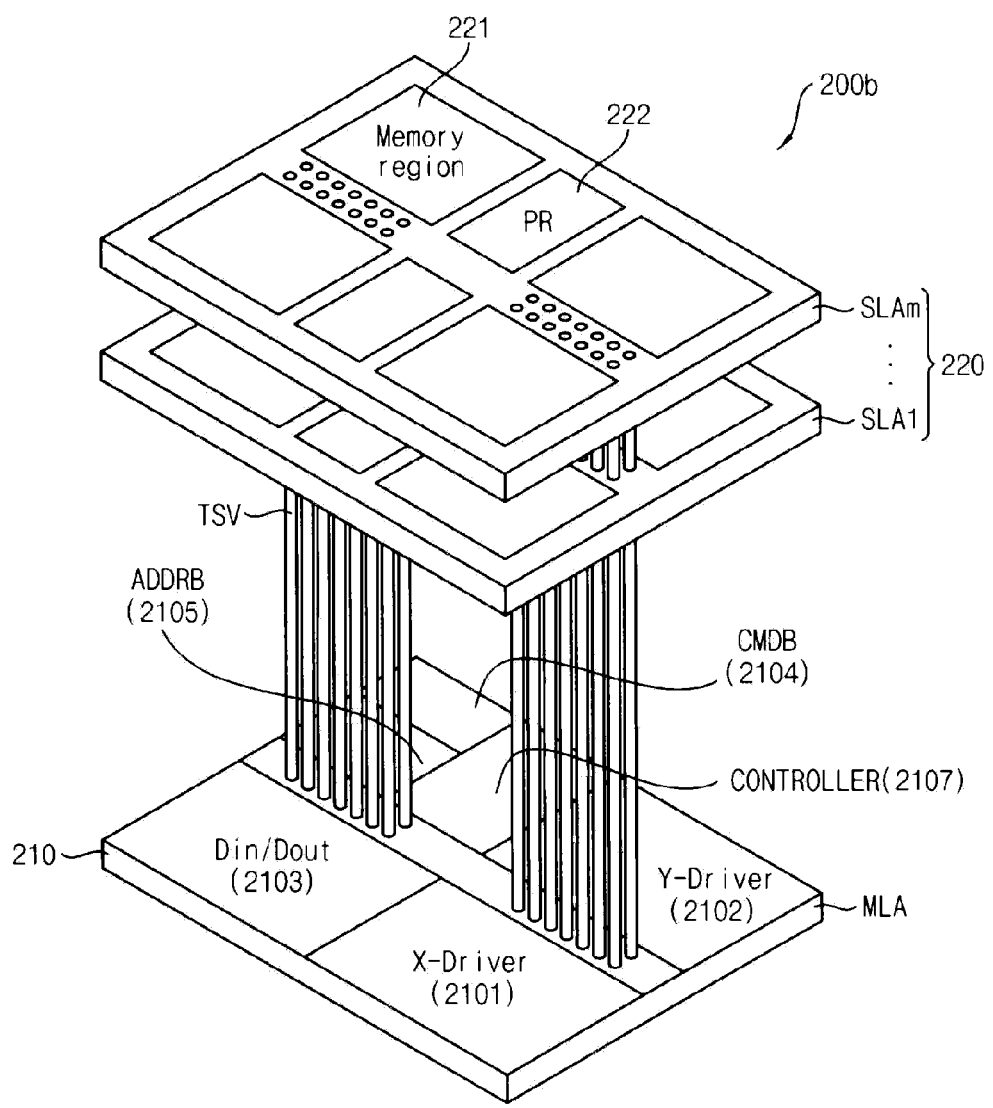
FIG. 11 is a block diagram illustrating an example of a memory device included in a memory system of FIG. 2 according to certain embodiments.

FIG. 11 is a block diagram illustrating an example of a memory device included in a memory system of FIG. 2 according to certain embodiments.

Referring to FIG. 11, a memory device 200b may include at least one master semiconductor layer MLA 210 and a plurality of slave semiconductor layers SLA1~SLAm 220. For example, each of the plurality of slave semiconductor layers SLA1~SLAm 220 may be a memory including a plurality of memory cells. Here, m represents a positive integer.

The master semiconductor layer MLA 210 and the plurality of slave semiconductor layers SLA1~SLAm 220 may be stacked on each other, and communicate signals with each other through through-substrate vias (e.g., through-silicon vias, TSV).

The master semiconductor layer MLA 210 may communicate with the memory controller 100 through a conductive structure formed on an external surface.

Hereinafter, a structure and an operation of the master semiconductor layer MLA 210 and the plurality of slave semiconductor layers SLA1~SLAm 220 will be described.

The master semiconductor layer MLA 210 may include various peripheral circuits for driving memory regions 221 included in each of the plurality of slave semiconductor layers SLA1~SLAm 220. For example, the master semiconductor layer MLA 210 may include a row decoder X-Driver 2101 for driving word lines of the memory, a column decoder Y-Driver 2102 for driving bit lines of the memory, a data input/output buffer Din/Dout 2103 for controlling input/output of data, a command buffer CMDB 2104 for receiving the command signal CMD from the memory controller 100 and buffering the command signal CMD, and an address buffer ADDRB 2105 for receiving the address signal ADDR from the memory controller 100 and buffering the address signal ADDR. Similar to the memory block 600 of FIG. 10, the memory region 221 may include a plurality of memory banks in which a plurality of memory cells are arranged.

In addition, the master semiconductor layer MLA 210 may further include a controller 2107. The controller 2107 may perform a write operation and a read operation on the memory regions 221 based on the command signal CMD and the address signal ADDR received from the memory controller 100.

Each of the plurality of slave semiconductor layers SLA1~SLAm 220 may include the memory regions 221 having the plurality of memory banks and peripheral circuit regions PR 222 in which peripheral circuits for reading and writing data of the memory regions 221, e.g., a row decoder, a column decoder, a bit line sense amplifier, etc. are arranged.

In some example embodiments, each of the plurality of slave semiconductor layers SLA1~SLAm 220 may be implemented with the memory device 200a of FIG. 4. For example, the peripheral circuit region PR 222 included in each of the plurality of slave semiconductor layers SLA1~SLAm 220 may include the power-up control circuit 400, the first through n-th switches 510-1, 510-2, ..., 510-n, and the first through n-th boost voltage generators 520-1, 520-2, ..., 520-n shown in FIG. 4.

When the electronic system 10 is being powered up, the power-up control circuit 400 included in each of the plurality of slave semiconductor layers SLA1~SLAm 220 may turn on the first through n-th boost voltage generators 520-1, 520-2, ..., 520-n consecutively with the first delay time DT1 or DT1' between activations while the reset signal RESET_N is maintained at the logic low level. If the reset signal RESET_N transitions from the logic low level to the logic high level before all of the first through n-th boost voltage generators 520-1, 520-2, ..., 520-n are turned on, the power-up control circuit 400 may change a turning on time of some of the first through n-th boost voltage generators 520-1, 520-2, ..., 520-n to the second delay time DT2' between activations, which is shorter than the first delay time DT1 or DT1'. The row decoder included in the peripheral circuit region PR 222 may provide the internal boost voltage VPP_I, which is provided by the first through n-th boost voltage generators 520-1, 520-2, ..., 520-n, to a word line coupled to a memory cell included in the memory region 221 to perform the write operation and the read operation.

In one embodiment, each of the plurality of slave semiconductor layers SLA1~SLAm 220 may disperse a current consumption over time during a power-up of the electronic system 10.

As a result, as described above with reference to FIGS. 1 to 10, the magnitude of the boost current IPP provided from the voltage regulator 300 to the memory device 200b of FIG. 11 may be maintained smaller than the threshold current Ith. As such, the memory device 200b may effectively prevent the electronic system 10 from shutting down at the initial stage of power-up of the electronic system 10.

In other example embodiments, the controller 2107 of the master semiconductor layer MLA 210 may include the power-up control circuit 400 of FIG. 4, and the peripheral circuit region PR 222 included in each of the plurality of slave semiconductor layers SLA1~SLAm 220 may include the first through n-th switches 510-1, 510-2, ..., 510-n, and the first through n-th boost voltage generators 520-1, 520-2, ..., 520-n of FIG. 4.

When the electronic system 10 is being powered up, the power-up control circuit 400 included in the controller 2107 of the master semiconductor layer MLA 210 may activate first through (m*n)-th power-up signals consecutively with the first delay time DT1 or DT1' between each power-up signal while the reset signal RESET_N is maintained at the logic low level. If the reset signal RESET_N transitions from the logic low level to the logic high level before all of the first through (m*n)-th power-up signals are activated, the power-up control circuit 400 may change an activation time of some of the first through (m*n)-th power-up signals to the second delay time DT2' between activations, which is shorter than the first delay time DT1 or DT1'. The first through n-th switches 510-1, 510-2, ..., 510-n included in the q-th slave semiconductor layer SLAq may be turned on consecutively in response to the ((q−1)*n+1)-th through (q*n)-th power-up signals provided by the power-up control circuit 400 of the master semiconductor layer MLA 210 through the TSVs. Here, q represents a positive integer equal to or smaller than m. The row decoder included in the peripheral circuit region PR 222 may provide the internal boost voltage VPP_I, which is provided by the first through n-th boost voltage generators 520-1, 520-2, ..., 520-n, to a word line coupled to a memory cell included in the memory region 221 to perform the write operation and the read operation.

In one embodiment, the memory device 200b may consecutively turn on the first through n-th boost voltage generators 520-1, 520-2, . . . , 520-n included in the first slave semiconductor layer SLAT, and then consecutively turn on the first through n-th boost voltage generators 520-1, 520-2, . . . , 520-n included in the second slave semiconductor layer SLA2, and lastly consecutively turn on the first through n-th boost voltage generators 520-1, 520-2, . . . , 520-n included in the m-th slave semiconductor layer SLAm. For example, the memory device 200b may further disperse a current consumption over time during a power-up of the electronic system 10.

As a result, as described above with reference to FIGS. 1 to 10, the magnitude of the boost current IPP provided from the voltage regulator 300 to the memory device 200b of FIG. 11 may be maintained smaller than the threshold current Ith. As such, the memory device 200b may effectively prevent the electronic system 10 from shutting down at the initial stage of power-up of the electronic system 10.

Figure 12:
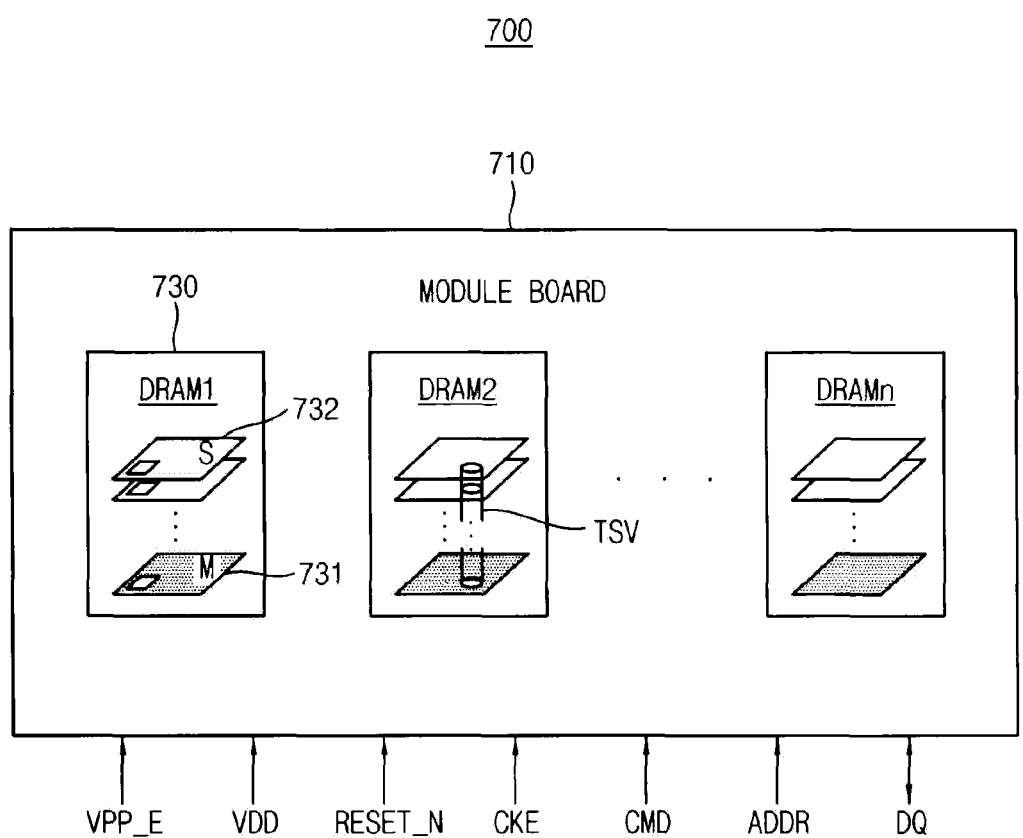
FIG. 12 is a block diagram illustrating a memory module including a memory device of FIG. 11 according to certain embodiments.

FIG. 12 is a block diagram illustrating a memory module including a memory device of FIG. 11 according to certain embodiments.

Referring to FIG. 12, a memory module 700 may include at least one memory device 730 mounted on a module board 710. For example, the memory device 730 may be constructed as a DRAM chip. In addition, the memory device 730 may include a stack of semiconductor layers. For example, the semiconductor layers may include at least one master semiconductor layer 731 and at least one slave semiconductor layer 732. Signal transfer between the semiconductor layers may be performed via through-substrate vias (e.g., through-silicon vias, TSVs).

The memory module 700 may receive the external boost voltage VPP_E and the power supply voltage VDD from the voltage regulator 300 of FIG. 3, receive the reset signal RESET_N, the clock enable signal CKE, the command signal CMD, and the address signal ADDR, and communicate data DQ with the memory controller 100. The external boost voltage VPP_E, the power supply voltage VDD, the reset signal RESET_N, the clock enable signal CKE, the command signal CMD, the address signal ADDR, and the data DQ may be provided to the memory device 730.

The memory device 730 may be implemented with the memory device 200b of FIG. 11. A structure and an operation of the memory device 200b are described above with reference to FIGS. 1 to 11. A detailed description of the memory device 730 will be omitted for convenience of illustration.

Figure 13:
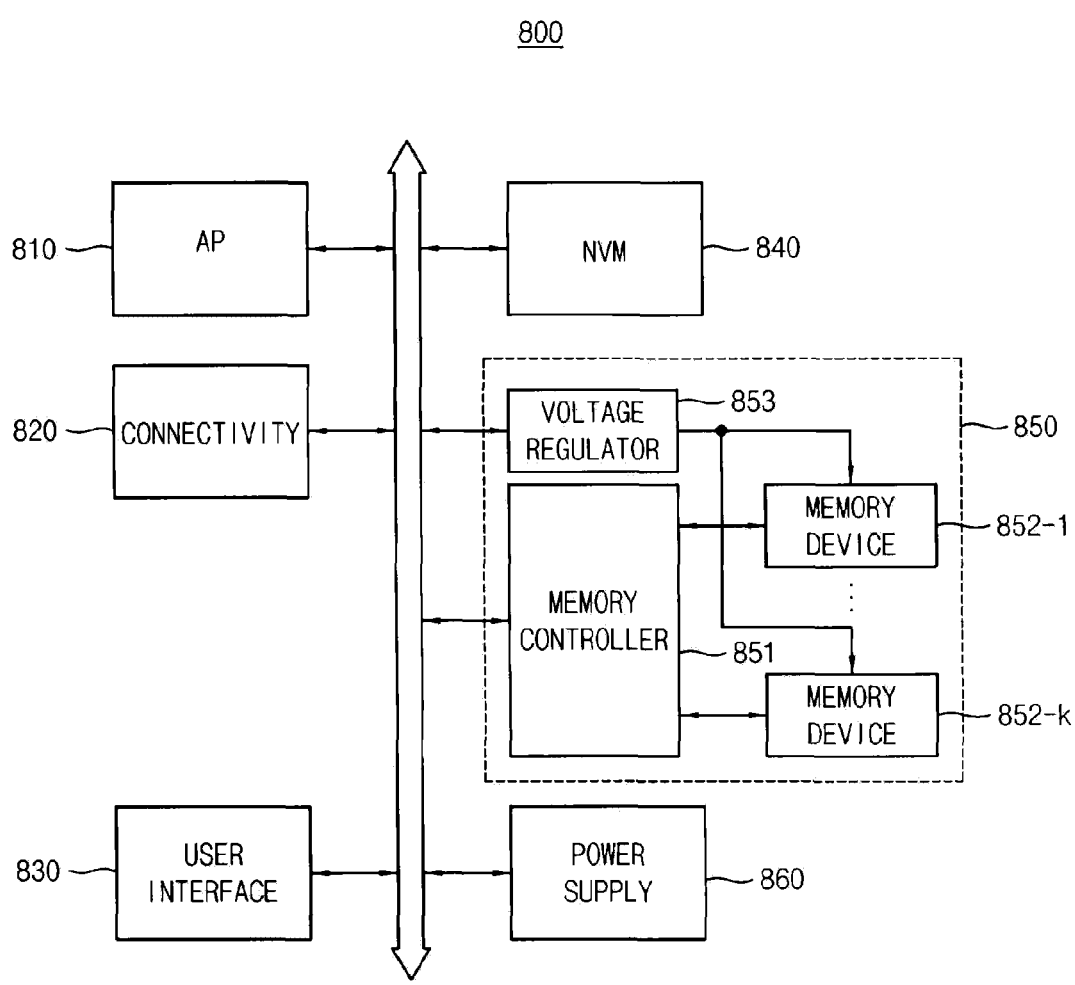
FIG. 13 is a block diagram illustrating a mobile system according to exemplary embodiments.

FIG. 13 is a block diagram illustrating a mobile system according to exemplary embodiments.

Referring to FIG. 13, a mobile system 800 includes an application processor AP 810, a connectivity circuit 820, a user interface 830, a nonvolatile memory device NVM 840, a memory system 850, and a power supply 860. In some embodiments, the mobile system 800 may be a mobile phone, a smart phone, a personal digital assistant (PDA), a portable multimedia player (PMP), a digital camera, a music player, a portable game console, a navigation system, etc.

The application processor 810 may execute applications, such as a web browser, a game application, a video player, etc. In some embodiments, the application processor 810 may include a single core or multiple cores. For example, the application processor 810 may be a multi-core processor, such as a dual-core processor, a quad-core processor, a hexa-core processor, etc. The application processor 810 may include an internal or external cache memory.

The connectivity circuit 820 may perform wired or wireless communication with an external device. For example, the connectivity circuit 820 may perform Ethernet communication, near field communication (NFC), radio frequency identification (RFID) communication, mobile telecommunication, memory card communication, universal serial bus (USB) communication, etc. In some embodiments, connectivity unit 820 may include a baseband chipset that supports communications, such as global system for mobile communications (GSM), general packet radio service (GPRS), wideband code division multiple access (WCDMA), high speed downlink/uplink packet access (HSxPA), etc.

The memory system 850 may include a memory controller 851, a plurality of memory devices 852-1~852-k, and a voltage regulator 853. The memory system 850 included in the mobile system 800 of FIG. 13 may be implemented with the memory system 30 of FIG. 1. A structure and an operation of the memory system 30 of FIG. 1 are described above with reference to FIGS. 1 to 12. A detailed description of the memory system 850 will be omitted for convenience of illustration.

The nonvolatile memory device 840 may store a boot image for booting the mobile system 800. For example, the nonvolatile memory device 840 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 830 may include at least one input device, such as a keypad, a touch screen, etc., and at least one output device, such as a speaker, a display device, etc. The power supply 860 may supply a power supply voltage to the mobile system 800.

In some embodiments, the mobile system 800 may further include an image processor, and/or a storage device, such as a memory card, a solid state drive (SSD), a hard disk drive (HDD), a CD-ROM, etc.

In some embodiments, the mobile system 800 and/or components of the mobile system 800 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 14:
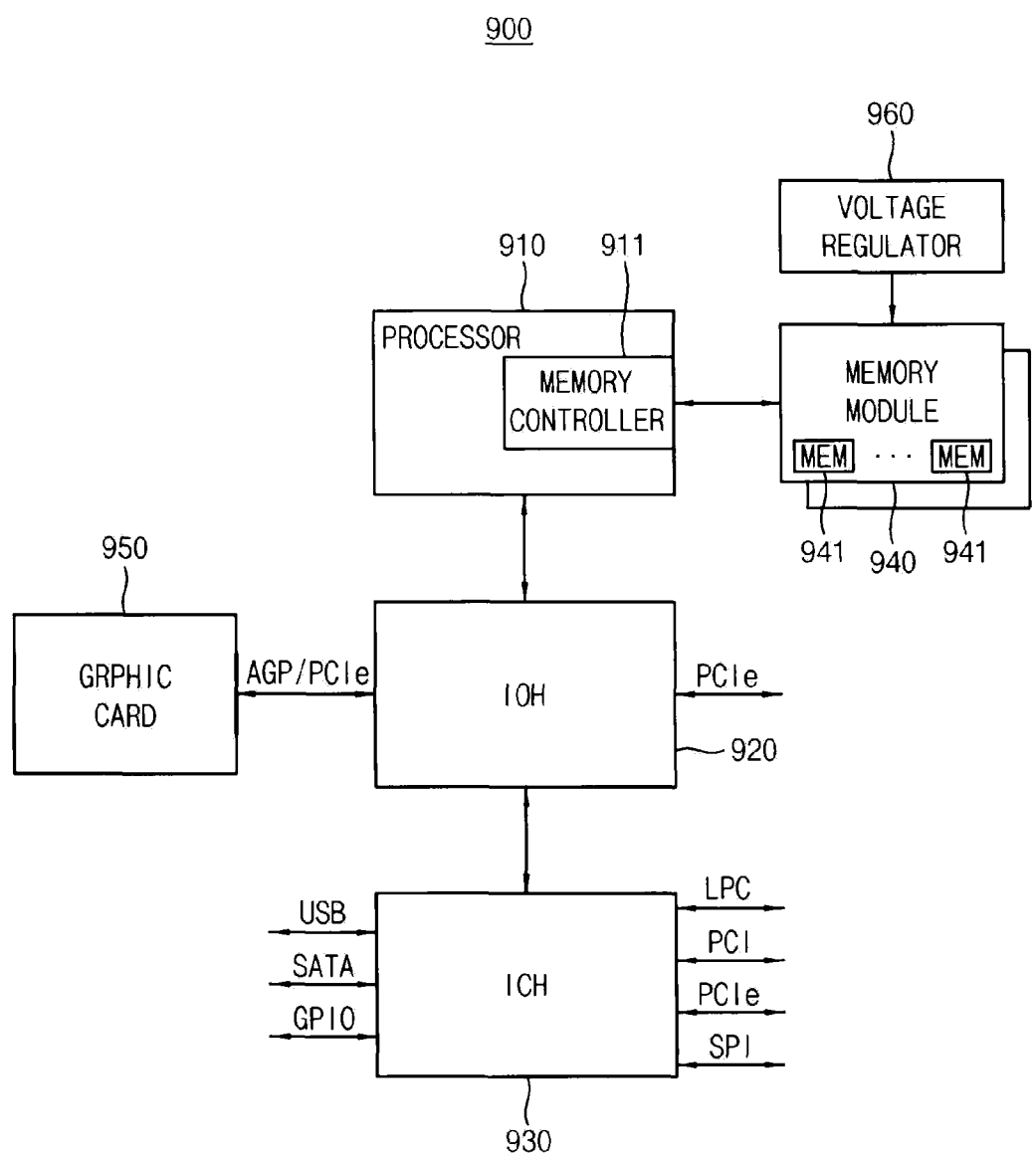
FIG. 14 is a block diagram illustrating a computing system according to exemplary embodiments.

FIG. 14 is a block diagram illustrating a computing system according to exemplary embodiments.

Referring to FIG. 14, a computing system 900 includes a processor 910, an input/output hub (IOH) 920, an input/output controller hub (ICH) 930, at least one memory module 940, a graphics card 950, and a voltage regulator 960. In some embodiments, the computing system 900 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 910 may perform various computing functions, such as executing specific software for performing specific calculations or tasks. For example, the processor 910 may be a microprocessor, a central process unit (CPU), a digital signal processor, or the like. In some embodiments, the processor 910 may include a single core or multiple cores. For example, the processor 910 may be a multi-core processor, such as a dual-core processor, a quad-core processor, a hexa-core processor, etc. Although FIG. 14 illustrates the computing system 900 including one processor 910, in some embodiments, the computing system 900 may include a plurality of processors.

The processor 910 may include a memory controller 911 for controlling operations of the memory module 940. The memory controller 911 included in the processor 910 may be referred to as an integrated memory controller (IMC). A memory interface between the memory controller 911 and the memory module 940 may be implemented with a single channel including a plurality of signal lines, or may bay be implemented with multiple channels, to each of which at least one memory module 940 may be coupled. In some embodiments, the memory controller 911 may be located inside the input/output hub 920. The input/output hub 920 including the memory controller 911 may be referred to as memory controller hub (MCH).

The memory module 940 may include a plurality of memory devices MEM 941 that store data provided from the memory controller 911. The voltage regulator 960 may provide various voltages to the plurality of memory devices 941 required for an operation of the plurality of memory devices 941.

A memory system including the memory controller 911, the voltage regulator 960 and the plurality of memory devices 941 may be implemented with the memory system 30 of FIG. 1. A structure and an operation of the memory system 30 of FIG. 1 are described above with reference to FIGS. 1 to 12. A detailed description of the memory controller 911, the voltage regulator 960 and the plurality of memory devices 941 will be omitted for convenience of illustration.

The input/output hub 920 may manage data transfer between processor 910 and devices, such as the graphics card 950. The input/output hub 920 may be coupled to the processor 910 via various interfaces. For example, the interface between the processor 910 and the input/output hub 920 may be a front side bus (FSB), a system bus, a HyperTransport, a lightning data transport (LDT), a QuickPath interconnect (QPI), a common system interface (CSI), etc. The input/output hub 920 may provide various interfaces with the devices. For example, the input/output hub 920 may provide an accelerated graphics port (AGP) interface, a peripheral component interface-express (PCIe), a communications streaming architecture (CSA) interface, etc. Although FIG. 14 illustrates the computing system 900 including one input/output hub 920, in some embodiments, the computing system 900 may include a plurality of input/output hubs.

The graphics card 950 may be coupled to the input/output hub 920 via AGP or PCIe. The graphics card 950 may control a display device for displaying an image. The graphics card 950 may include an internal processor for processing image data and an internal memory device. In some embodiments, the input/output hub 920 may include an internal graphics device along with or instead of the graphics card 950 outside the graphics card 950. The graphics device included in the input/output hub 920 may be referred to as integrated graphics. Further, the input/output hub 920 including the internal memory controller and the internal graphics device may be referred to as a graphics and memory controller hub (GMCH).

The input/output controller hub 930 may perform data buffering and interface arbitration to efficiently operate various system interfaces. The input/output controller hub 930 may be coupled to the input/output hub 920 via an internal bus, such as a direct media interface (DMI), a hub interface, an enterprise Southbridge interface (ESI), PCIe, etc.

The input/output controller hub 930 may provide various interfaces with peripheral devices. For example, the input/output controller hub 930 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 910, the input/output hub 920 and the input/output controller hub 930 may be implemented as separate chipsets or separate integrated circuits. In other embodiments, at least two of the processor 910, the input/output hub 920 and the input/output controller hub 930 may be implemented as a single chipset.

The foregoing is illustrative of the present disclosure and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory device comprising:
   a power-up control circuit configured to consecutively activate a first set of power-up signals with a first delay time between each power-up signal of the first set of power-up signals in response to a rise of a power supply voltage and a reset signal having a first logic level at an initial stage of power-up; and
   a first set of boost voltage generators configured to generate an internal boost voltage based on an external boost voltage and the first set of power-up signals,
   wherein the first set of boost voltage generators are configured to activate before the reset signal transitions from the first logic level to a second logic level opposite to the first logic level.

2. The memory device of claim 1, further comprising:
   a second set of boost voltage generators configured to generate the internal boost voltage based on the external boost voltage,
   wherein the power-up control circuit is further configured to, after the reset signal transitions from the first logic level to a second logic level opposite to the first logic level, consecutively activate a second set of power-up signals with a second delay time between each power-up signal of the second set of power-up signals shorter than the first delay time, and
   wherein the second set of boost voltage generators are configured to activate in response to the second set of power-up signals, respectively.

3. The memory device of claim 2, wherein a number of each of the first and second sets of power-up signals is variable based on a time between a rising time of the power supply voltage and a transitioning time of the reset signal from the first logic level to the second logic level.

4. The memory device of claim 2, wherein the power-up control circuit includes:
- a pulse generation circuit configured to generate a first pulse signal having a first period when the power supply voltage is at a first level and the reset signal is at the first logic level, and to generate a second pulse signal having a second period shorter than the first period when the reset signal is at the second logic level; and
- a pulse control circuit configured to consecutively activate the first set of power-up signals in response to the first pulse signal, and to consecutively activate the second set of power-up signals in response to the second pulse signal.

5. The memory device of claim 4, wherein the pulse generation circuit includes:
- an inverter configured to invert the reset signal to generate an inverted reset signal;
- a first AND gate configured to perform an AND operation on the power supply voltage and the inverted reset signal to generate a first enable signal;
- a second AND gate configured to perform an AND operation on the power supply voltage and the reset signal to generate a second enable signal;
- a first pulse generator configured to generate the first pulse signal in response to the first enable signal being activated; and
- a second pulse generator configured to generate the second pulse signal in response to the second enable signal being activated.

6. The memory device of claim 1, further comprising:
a memory cell array including a plurality of memory cells connected to a plurality of word lines,
wherein the internal boost voltage is provided to a word line of the plurality of word lines.

7. The memory device of claim 1, further comprising:
a plurality of memory banks each of which includes a plurality of memory cells; and
a plurality of bank row decoders coupled to the plurality of memory banks through a plurality of word lines,
wherein the plurality of bank row decoders provide the internal boost voltage to at least one of the plurality of word lines based on a row address.

8. A memory system comprising:
a voltage regulator configured to output a first boost voltage and a power supply voltage at an initial stage of power-up of the memory system;
a memory controller configured to transition a reset signal from a first logic level to a second logic level opposite to the first logic level after a first time period from a time at which the voltage regulator outputs the power supply voltage; and
a memory device including a plurality of internal circuits, the memory device being configured to activate a first set of internal circuits of the plurality of internal circuits consecutively with a first delay time between the activation of each internal circuit of the first set of internal circuits in response to the power supply voltage, and to activate a second set of internal circuits of the plurality of internal circuits consecutively with a second delay time between the activation of each internal circuit of the second set of internal circuits shorter than the first delay time in response to the reset signal transitioning from the first logic level to the second logic level.

9. The memory system of claim 8, wherein the plurality of internal circuits include at least one boost voltage generator configured to generate a second boost voltage based on the first boost voltage.

10. The memory system of claim 8, wherein the memory device includes:
- a power-up control circuit configured to consecutively activate a first set of power-up signals with the first delay time between activations in response to the power supply voltage and the reset signal having the first logic level, and to activate a second set of power-up signals consecutively with the second delay time between activations in response to the power supply voltage and the reset signal having the second logic level, and
- wherein the first and second sets of internal circuits include boost voltage generators configured to generate a second boost voltage based on the first boost voltage, and include a plurality of switches each connected to a corresponding boost voltage generator, the switches being configured to consecutively activate in response to the first and second sets of power-up signals, respectively.

11. The memory system of claim 10, wherein the power-up control circuit includes:
- a pulse generation circuit configured to generate a first pulse signal having a first period when the power supply voltage is at a first level and the reset signal is at the first logic level, and to generate a second pulse signal having a second period shorter than the first period when the reset signal is at the second logic level; and
- a pulse control circuit configured to consecutively activate the first set of power-up signals in response to the first pulse signal, and to consecutively activate the second set of power-up signals in response to the second pulse signal.

12. The memory system of claim 11, wherein the pulse generation circuit includes:
- an inverter configured to invert the reset signal to generate an inverted reset signal;
- a first AND gate configured to perform an AND operation on the power supply voltage and the inverted reset signal to generate a first enable signal;
- a second AND gate configured to perform an AND operation on the power supply voltage and the reset signal to generate a second enable signal;
- a first pulse generator configured to generate the first pulse signal in response to the first enable signal being activated; and
- a second pulse generator configured to generate the second pulse signal in response to the second enable signal being activated.

13. The memory system of claim 10, further comprising:
a memory cell array including a plurality of memory cells connected to a plurality of word lines,
wherein the second boost voltage is provided to a word line of the plurality of word lines.

14. The memory system of claim 8, wherein the memory device includes a plurality of semiconductor layers, which are stacked on each other and communicate signals with each other through through-substrate vias (TSVs),
wherein each of the plurality of semiconductor layers includes:

a power-up control circuit configured to consecutively activate a first set of power-up signals with the first delay time between activations in response to the power supply voltage and the reset signal having the first logic level, and to activate a second set of power-up signals consecutively with the second delay time between activations in response to the power supply voltage and the reset signal having the second logic level, and wherein the first and second sets of internal circuits include boost voltage generators configured to generate a second boost voltage based on the first boost voltage, and include a plurality of switches each connected to corresponding boost voltage generator, the switches being configured to consecutively activate in response to the first and second sets of power-up signals, respectively.

15. The memory system of claim 8, wherein the memory device includes a master semiconductor layer and first through m-th slave semiconductor layers, which are stacked on each other and communicate signals with each other through through-substrate vias (TSVs), where m is a positive integer, wherein the master semiconductor layer includes:
a power-up control circuit configured to consecutively activate a first set of power-up signals with the first delay time between activations in response to the power supply voltage and the reset signal having the first logic level, and to consecutively activate a second set of power-up signals with the second delay time between activations in response to the power supply voltage and the reset signal having the second logic level, and wherein the k-th slave semiconductor layer includes:
the first and second sets of internal circuits including boost voltage generators configured to generate a second boost voltage based on the first boost voltage and a plurality of switches each connected to a corresponding boost voltage generator, the switches being configured to turn on consecutively in response to the first and second sets of power-up signals, respectively.

16. An electronic device comprising:
a power-up control circuit configured to, during a power-up of the semiconductor device, consecutively generate a first set of activation signals with a first delay time between each activation signal of the first set of activation signals in response to a power supply voltage and a reset signal having a first logic level; and
a first set of internal circuits configured to activate in response to the first set of activation signals, respectively,
wherein the first set of internal circuits is configured to activate before the reset signal transitions from the first logic level to the second logic level.

17. The electronic device of claim 16, further comprising:
a memory cell array including a plurality of memory cells connected to a plurality of word lines,
wherein at least one of the first set of internal circuits is a boost voltage generator configured to generate an internal boost voltage based on an external boost voltage greater than the power supply voltage and to apply the internal boost voltage on a word line of the plurality of word lines.

18. The electronic device of claim 17, further comprising:
a memory controller configured to generate the reset signal; and
a voltage regulator configured to generate the power supply voltage and the external boost voltage,
wherein the first voltage level of the power supply voltage is equal to a level of the power supply voltage and greater than a ground voltage.

19. The electronic device of claim 16, further comprising:
a second set of internal circuits,
wherein the power-up control circuit is further configured to, after the reset signal transitions from the first logic level to the second logic level, consecutively generate a second set of activation signals with a second delay time between each activation signal of the second set of activation signals shorter than the first delay time, and
wherein the second set of internal circuits are configured to activate in response to the second set of activation signals, respectively.

20. The electronic device of claim 19, wherein the power-up control circuit is configured to generate a first activation signal of the first set of activation signals in response to the power supply voltage having a threshold voltage level greater than a ground voltage and less than a full level of the power supply voltage.

* * * * *